(12) United States Patent
McConnell et al.

(10) Patent No.: US 8,858,819 B2
(45) Date of Patent: Oct. 14, 2014

(54) METHOD FOR CHEMICAL MECHANICAL PLANARIZATION OF A TUNGSTEN-CONTAINING SUBSTRATE

(75) Inventors: Rachel Dianne McConnell, Scottsdale, AZ (US); Ann Marie Hurst, Chandler, AZ (US); Xiaobo Shi, Chandler, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 219 days.

(21) Appl. No.: 13/014,009

(22) Filed: Jan. 26, 2011

(65) Prior Publication Data

US 2012/0028466 A1 Feb. 2, 2012

Related U.S. Application Data

(60) Provisional application No. 61/304,574, filed on Feb. 15, 2010.

(51) Int. Cl.
*C03C 15/00* (2006.01)
*C09G 1/02* (2006.01)
*H01L 21/321* (2006.01)
*B24B 37/04* (2012.01)

(52) U.S. Cl.
CPC .............. *H01L 21/3212* (2013.01); *C09G 1/02* (2013.01); *B24B 37/044* (2013.01)
USPC ................ 216/88; 216/37; 216/67; 252/79.1; 252/79.2; 252/79.3; 252/79.4

(58) Field of Classification Search
USPC ........................ 216/37, 67, 88; 252/79.1–79.4
See application file for complete search history.

(56) References Cited

U.S. PATENT DOCUMENTS

| | | |
|---|---|---|
| 5,518,528 A | 5/1996 | Tom et al. |
| 5,704,965 A | 1/1998 | Tom et al. |
| 5,704,967 A | 1/1998 | Tom et al. |
| 5,707,424 A | 1/1998 | Tom et al. |
| 5,935,305 A | 8/1999 | Tom et al. |
| 5,985,008 A | 11/1999 | Tom et al. |
| 6,083,298 A | 7/2000 | Wang et al. |
| 6,125,131 A | 9/2000 | Brandes et al. |
| 6,132,492 A | 10/2000 | Hultquist et al. |
| 6,277,173 B1 | 8/2001 | Sadakata et al. |
| 6,406,519 B1 | 6/2002 | Tom et al. |
| 6,453,924 B1 | 9/2002 | Wang et al. |
| 6,540,819 B2 | 4/2003 | Tom et al. |
| 6,561,213 B2 | 5/2003 | Wang et al. |
| 6,605,134 B2 | 8/2003 | Ishihara et al. |
| 6,660,063 B2 | 12/2003 | Tom et al. |
| 7,169,210 B2 | 1/2007 | Baksh et al. |
| 7,247,566 B2 * | 7/2007 | Carter et al. .................. 438/692 |
| 7,258,725 B2 | 8/2007 | Ohmi et al. |
| 7,261,763 B2 | 8/2007 | Shirley |
| 7,285,154 B2 | 10/2007 | Karwacki, Jr. et al. |
| 7,294,172 B2 | 11/2007 | Baksh et al. |
| 2002/0043026 A1 * | 4/2002 | Luo et al. ......................... 51/304 |
| 2002/0125460 A1 * | 9/2002 | Tredinnick .................... 252/79.1 |
| 2003/0139050 A1 * | 7/2003 | Thomas et al. ............... 438/692 |
| 2005/0090109 A1 | 4/2005 | Carter et al. |
| 2006/0021421 A1 | 2/2006 | Downie et al. |

FOREIGN PATENT DOCUMENTS

| | | |
|---|---|---|
| WO | 96/11739 | 4/1996 |
| WO | 97/44118 | 11/1997 |
| WO | 99/59701 | 11/1999 |
| WO | 00/12196 | 3/2000 |
| WO | 01/83084 A1 | 11/2001 |
| WO | 02/07861 A1 | 1/2002 |
| WO | 03/097215 A1 | 11/2003 |

OTHER PUBLICATIONS

Shinn, Gregory B., et al., "Chemical-Mechanical Polish", Handbook of Semiconductor Manufacturing Technology, Chapter 15, pp. 415-460, New York City (2000).

* cited by examiner

*Primary Examiner* — Lan Vinh
*Assistant Examiner* — Maki Angadi
(74) *Attorney, Agent, or Firm* — Lina Yang

(57) ABSTRACT

The titled method affords low dishing levels in the polished substrate while simultaneously affording high metal removal rates. The method utilizes an associated polishing composition. Components in the composition include a poly(alkyleneimine) such as polyethyleneimine, an abrasive, an acid, and an oxidizing agent, such as a per-compound.

20 Claims, No Drawings

METHOD FOR CHEMICAL MECHANICAL PLANARIZATION OF A TUNGSTEN-CONTAINING SUBSTRATE

This application claims priority to U.S. provisional application 61/304,574 filed on Feb. 15, 2010, the entire contents of which is incorporated herein by reference thereto for all allowable purposes.

BACKGROUND OF THE INVENTION

This invention relates generally to the chemical-mechanical planarization (CMP) of tungsten-containing substrates on semiconductor wafers and slurry compositions therefor. This invention is especially useful for tungsten CMP where low dishing/plug recess and low array erosion on planarized substrates is desired and/or required.

Chemical mechanical planarization (chemical mechanical polishing, CMP) for planarization of semiconductor substrates is now widely known to those skilled in the art and has been described in numerous patents and open literature publications. An introductory reference on CMP is as follows: "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad parallel to the substrate. Polishing is continued in this manner until the desired film on the substrate is removed with the usual objective being to effectively planarize the substrate. Typically metal CMP slurries contain an abrasive material, such as silica or alumina, suspended in an oxidizing, aqueous medium.

There are a large number of materials used in the manufacture of integrated circuits such as a semiconductor wafer. The materials generally fall into three categories—dielectric material, adhesion and/or barrier layers, and conductive layers. The use of the various substrates, e.g., dielectric material such as TEOS, PETEOS, and low-k dielectric materials; barrier/adhesion layers such as tantalum, titanium, tantalum nitride, and titanium nitride; and conductive layers such as copper, aluminum, tungsten, and noble metals are known in the industry.

Integrated circuits are interconnected through the use of well-known multilevel interconnections. Interconnection structures normally have a first layer of metallization, an interconnection layer, a second level of metallization, and typically third and subsequent levels of metallization. Interlevel dielectric materials such as silicon dioxide and sometimes low-k materials are used to electrically isolate the different levels of metallization in a silicon substrate or well. The electrical connections between different interconnection levels are made through the use of metallized vias and in particular tungsten vias. U.S. Pat. No. 4,789,648 describes a method for preparing multiple metallized layers and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to the dielectric material.

In one semiconductor manufacturing process, metallized vias or contacts are formed by a blanket tungsten deposition followed by a CMP step. In a typical process, via holes are etched through the interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess tungsten is removed by chemical mechanical polishing (CMP) to form metal vias.

The ratio of the removal rate of a metal (e.g., tungsten) to the removal rate of a dielectric base is called the "selectivity" for removal of the metal in relation to removal of the dielectric during CMP processing of substrates comprised of metal and dielectric material. When CMP slurries with high selectivity for removal of metal in relation to dielectric are used, the metal layers are easily over-polished creating a depression or "dishing" effect in the metalized areas. This feature distortion is unacceptable due to lithographic and other constraints in semiconductor manufacturing.

Another feature distortion that is unsuitable for semiconductor manufacturing is called "erosion." Erosion is the topography difference between a field of dielectric and a dense array of metal vias or trenches. In CMP, the materials in the dense array may be removed or eroded at a faster rate than the surrounding field of dielectric. This causes a topography difference between the field of dielectric and the dense metal (e.g., copper or tungsten) array.

As industry standards trend toward smaller device features, there is an ever-developing need for CMP slurries that deliver superior planarization of the nanostructures of IC chips. Specifically, for 45 nm technology nodes and smaller feature sizes, slurry products must deliver low removal rate selectivity between metal and dielectric, thereby lowering erosion while maintaining sufficient removal rate and low defect levels. Furthermore, in the competitive market of CMP consumables, low cost of ownership (CoO), specifically through concentration of CMP slurry, is quickly becoming an industry standard.

A typically used CMP slurry has two actions, a chemical component and a mechanical component. An important consideration in slurry selection is "passive etch rate." The passive etch rate is the rate at which a metal (e.g., copper) is dissolved by the chemical component alone and should be significantly lower than the removal rate when both the chemical component and the mechanical component are involved. A large passive etch rate leads to dishing of the metallic trenches and vias, and thus, preferably, the passive etch rate is less than 10 nanometers per minute.

These are three general types of layers that can be polished. The first layer is interlayer dielectrics (ILD), such as silicon oxide and silicon nitride. The second layer is metal layers such as tungsten, copper, aluminum, etc., which are used to connect the active devices. This application addresses polishing the metal layer, particularly tungsten. The third type of layer is an adhesion/barrier layer such as titanium nitride.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution such as hydrogen peroxide, ferric nitrate, etc. Then the mechanical abrasive action of the particles continuously and simultaneously removes this oxide layer which is formed on the metal layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal and enhancing the diffusion of reactants and products to and away from the surface by mixing and by reducing the thickness of the boundary layer.

The slurry composition is an important factor in the CMP step. Depending on the choice of the oxidizing agent, the abrasive, and other useful additives, the polishing slurry can be tailored to provide effective polishing of metal layers at desired polishing rates while minimizing surface imperfections, defects, corrosion, and erosion of oxide in areas with tungsten vias. Furthermore, the polishing slurry may be used to provide controlled polishing selectivity to other thin-film materials used in current integrated circuit technology such as titanium, titanium nitride and the like.

There is a significant need for tungsten CMP process(es) and slurry(s) that afford low dishing and plug recess effects especially in view of the fact that the semiconductor industry continues to move towards smaller and smaller feature sizes. The present invention provides a solution to this significant need.

BRIEF SUMMARY OF THE INVENTION

In an embodiment, the invention is a method of chemical mechanical polishing of a substrate comprising tungsten, said method comprising: movably contacting a surface of the substrate with a) an abrasive, and b) a liquid component comprising: water; an acid, preferably a mineral acid, sufficient to provide a pH of 2 to 5, for example between 2.5 and 4.5; a per-type oxidizer; between 1 ppm and 100 ppm of a copper or iron compound which reacts at elevated temperature with the per-type oxidizer to synergistically increase tungsten removal rates; and between 0.1 and 10 ppm of a poly(alkyleneimine), for example an oligomer comprising or consisting essentially of ethyleneimine, propyleneimine, or both, for example of molecular weight from about 2000 to over 1000000, more typically between 10000 and 140000.

In an embodiment, the invention is a method of chemical mechanical polishing of a substrate comprising tungsten, said method comprising: movably contacting a surface of the substrate with a) an abrasive, and b) a liquid component comprising: water; an acid, preferably a mineral acid, sufficient to provide a pH of 2 to 5, for example between 2.5 and 4.5; a per-type oxidizer; between 1 ppm and 100 ppm of an iron compound which reacts at elevated temperature with the per-type oxidizer to synergistically increase tungsten removal rates; and between 0.1 and 10 ppm of a polyethyleneimine, wherein in a preferred embodiment the liquid component is substantially free of carboxylic acids, and wherein the polishing removes greater than 2000 angstroms per minute ("A/min") of tungsten at 3 psi downforce. If the iron is bound to the surface of the abrasive, then the total iron in the slurry is typically 5 ppm to 20 ppm, based on the total weight of the slurry.

In another embodiment, the invention is a method of chemical mechanical polishing of a substrate comprising tungsten, said method comprising: movably contacting a surface having tungsten thereon with a) an abrasive suspended in a liquid to form a slurry, said slurry comprising: between 0.3 and 1% by weight, for example between 0.4 and 0.7% by weight, of said abrasive, said liquid comprising water, an acid sufficient to provide a pH of 2 to 5, a per-type oxidizer, and between 0.1 and 10 ppm of a polyethyleneimine, said liquid being substantially free of fluoride-containing compounds, wherein the polishing removes greater than 2000 angstroms per minute of tungsten.

In another embodiment, the invention is a method of chemical mechanical polishing of a substrate comprising tungsten, said method comprising: movably contacting a surface having tungsten thereon with a) an abrasive comprising silica, and b) a liquid component comprising water, an acid sufficient to provide a pH of 2 to 5, a per-type oxidizer, and between 0.1 and 10 ppm of a polyethyleneimine, and between 0.01 and 4 ppm of tetraethylenepentamine, wherein the polishing removes greater than 2000 angstroms per minute of tungsten.

In another embodiment, the invention is a method of chemical mechanical polishing of a substrate comprising tungsten, said method comprising: movably contacting a surface of the substrate with a) an abrasive, and b) a liquid component comprising water, an acid sufficient to provide a pH of 2 to 5, a per-type oxidizer, between 1 ppm and 60 ppm of an iron compound which reacts at elevated temperature induces free radicals from with the per-type oxidizer to increase tungsten removal rates, and between 0.1 and 10 ppm of a polyethyleneimine, and wherein the polishing removes greater than 2000 angstroms per minute of tungsten.

In another embodiment, the invention is a method of chemical mechanical polishing of a substrate comprising tungsten, said method comprising: movably contacting a surface of the substrate with a slurry comprising: a first silica abrasive having an average diameter of between 30 and 90 nm and having iron bound to a surface thereof, said iron being able to induce free radicals at elevated temperature from a per-type oxidizer to increase tungsten removal rates; a second abrasive comprising silica having an average diameter of between 120 and 240 nm; water; an acid sufficient to provide a pH of 2 to 5; a per-type oxidizer; and between 0.1 and 10 ppm of a polyethyleneimine, and wherein the polishing removes greater than 2000 angstroms per minute of tungsten.

For each of the embodiments described in the above five paragraphs, the following refinements, alone or in any combination, can be beneficially employed. In each of the embodiments above, the term polyethyleneimine means polymers and oligomers comprising or consisting essentially of units of ethyleneimine, for example of molecular weight from about 2000 to over 1000000, more typically between 10000 and 140000.

In each of the above embodiments, the tungsten removal rate is advantageously greater than 2000 A/min, but is preferably greater that 3000 A/min, and most preferably greater than 4000 A/min. In each of the above embodiments, while the dielectric material may also be polished if exposed to the slurry, use of preferred slurries of this embodiment will result in dielectric layer polishing rates below 500 A/min at 3 psi, for example below 400 A/min at 3 psi downforce, preferably below 100 A/min at 3 psi. In each of the above five embodiments, while various other material may also be polished if exposed to the slurry, use of preferred slurries of this embodiment will result in polysilicon polishing rates below 500 A/min at 3 psi, for example below 400 A/min at 3 psi downforce, preferably below 200 A/min at 3 psi. The polyethyleneimine is most preferably present in an amount below 6 ppm, for example below 5 ppm, for example between 1 and 4 ppm. Use of greater amounts of polyethylenimine results in reduced tungsten removal rates while there is little added static etch corrosion protection. In each of the above five embodiments, preferably the amount of polyethyleneimine is between 0.1 and 4 ppm, for example between 0.3 and 3 ppm. The term "ppm" means parts per million by weight of the slurry (liquid plus abrasive), or of the liquid component if there is no abrasive suspended in the liquid. In each of the above five embodiments an exemplary pH is 2.5-4.5, more preferably 2.5-4, for example from 2.5-3.5. At low pH, chelators are not as necessary. Chelators can degrade slurry characteristics during long-term storage, and make clean-up and disposal/reuse of water difficult. In one aspect of each of the above five embodiments the presence of carbon-containing compounds in the liquid (other than the less than 10 ppm or less of polyethyleneimine) and especially polyether amine and carboxylic acids is not preferred and in a preferred embodiment the polishing composition is free of polyether amine and/or carboxylic acids, or contains less than 50 ppm, 20 ppm, 10 ppm, or 5 ppm of these carbon containing compounds. In one aspect of each of the above embodiments, the liquid portion of the polishing composition further comprises between about 0.1 to about 5 ppm of tetraethylenepentamine. In one aspect of each of the above five embodiments the polishing composition is free of fluorine compounds, especially fluoride-containing compounds which attack dielectric materials, and in a preferred embodiment the polishing composition is free of fluoride-containing compounds, or contains less than 50 ppm, 20 ppm, 10 ppm, or 5 ppm of fluorine-containing compounds. None or less than 1 ppm of fluorine-containing compounds is more preferred. In one aspect of each of the above five embodiments the per-type oxidizing agent is essential, and preferred embodiments include one or more of iron or copper compounds, typically in an amount between 5 ppm and 60 ppm and preferably bound to the surface of at least one class of silica abrasive, in an amount sufficient to induce free radicals at elevated temperature from the per-type oxidizing agents to synergistically increase tungsten removal rates. In one aspect of each of the above five embodiments the polishing composition is free of chelating compounds, for example polycarboxylic acids, and in a preferred embodiment the polishing composition is free of chelating compounds, or contains less than 50 ppm, 20 ppm, 10 ppm, or 5 ppm of chelating compounds. None or less than 1 ppm of chelating compounds is more preferred. It is surprising that high tungsten removal rates and low contamination can be obtained with no chelating compounds (other than the trace amount of polyimine, e.g., polyethyleneimine, present in the slurry. In one aspect of each of the above five embodiments the polishing composition is free of polyamine azoles, or alternatively contains less than 50 ppm, 20 ppm, 10 ppm, 5 ppm, or 1 ppm of polyamine azoles. In one aspect of each of the above five embodiments, the polishing composition is free of reducing agents such as formic acid, oxalic acid or formaldehyde, or contains less than 50 ppm, 20 ppm, 10 ppm, or 5 ppm of reducing agents, such as formic acid, oxalic acid or formaldehyde. Advantageously, in each of the above five embodiments the slurry contains a bimodal distribution of abrasive sizes, and preferably a trimodal distribution of abrasive sizes. Particle sizes are given in terms of the average diameter, where typically a large sample of particles of a particular size will have particles that range within about 20% to 30% of the average particle diameter which defines that sample. Polishing generates heat, and the reactivity of iron-activated per-type oxidizers such as hydrogen peroxide activated to form free radicals homolytically from the hydrogen peroxide induced by small quantities of iron compounds is very heat sensitive. The heat generated by polishing and the heat removed by conduction and by other means varies by position relative to the wafer and the polishing pad, and as a result the temperature of the slurry against a wafer being polished may vary by position relative to the wafer. The reactivity of iron-activated per-type oxidizers such as hydrogen peroxide activated to form free radicals homolytically from the hydrogen peroxide induced by small quantities of iron compounds is very heat sensitive. This can lead to excessive removal rates in the middle of a wafer. The heat effects of use of small (average particle diameter being some value between 30 nm to 90 nm, for example a value between 40 nm and 70 nm) iron coated particles with a per-type oxidizer can be substantially remediated by including a portion of larger particles, for example a non-iron-coated silica abrasive having an average particle size of about 3 to 5 times the size of the smaller iron-coated particles. The smaller particles need not be iron coated if a portion of the iron is distributed on other abrasives. The amount of large abrasive is typically between 0.2 and 2 times, for example, between 0.5 and 1.5 times the weight percent of the small diameter abrasive. Further, the presence of an intermediate-sized abrasive, for example particles of between 1.5 to 2.5 times the diameter of the smaller iron-coated particles, can substantially increase tungsten removal rates with no increase or even a decrease in dishing. The amount of intermediate-sized abrasive is typically between 0.2 and 6 times, for example, between 0.5 and 5 times, preferably 0.6 to 1.5 times the weight percent of the small diameter abrasive. Additional intermediate-sized abrasive can be included but is not particularly beneficial. Each of the refinements in this paragraph can apply to any of the five primary embodiments of the invention, and can further be combined with other refinements, as the benefits of the various refinements each result in superior performance.

DETAILED DESCRIPTION OF THE INVENTION

This invention involves a method that utilizes an associated slurry for chemical mechanical planarization of a tungsten-containing substrate. Minimization or prevention of dishing/erosion and plug recess of features on semiconductor substrates as well as tunability of selectivity during CMP processing is becoming increasingly more important as the semiconductor industry trends to smaller and smaller feature sizes in the manufacture of integrated circuits.

The slurry that is utilized according to the method of the invention is for polishing tungsten and is described next. The slurry comprises a polyethyleneimine, an oxidizing agent (e.g., a per-type oxidizer), a liquid component comprising water, an acid, and an abrasive. Optionally, the slurry can contain an iron compound to induce free radical formation from the per-type oxidizer to increase tungsten removal rates The polyethyleneimine (PEI) of the slurry can be either branched or linear. Preferred polyethyleneimines are branched polyethyleneimines. Preferably at least half of the polyethyleneimines are branched. Linear polyethyleneimines contain all secondary amines, in contrast to branched PEIs which contain primary, secondary and tertiary amino groups. A branched polyethyleneimine can be represented by the formula $(-NHCH_2CH_2-)_x[-N(CH_2CH_2NH_2)CH_2CH_2-]_y$, where x can be 2 to >40; and y can be 2 to >40, preferably each of x and y are independently 11 to 40, alternately, each of x and y are independently 6 to 10, further alternatively x and y are independently 2-5, which is shown below:

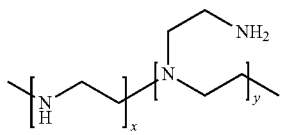

The PEI reduces static etch or erosion to essentially nil, that is, below 20 A/min. One problem with aggressive tungsten slurries is that the chemistry can attack tungsten during for example idle periods when there is no polishing, that is, no movement of abrasives sufficient to remove the oxide coating formed by the oxidizing system. In the absence of PEI, static etch for iron catalyzed peroxide systems can be as high as 200 to 300 A/min. As little as 0.1 ppm of PEI reduces static etch, and as little as 1 or 2 ppm PEI can reduce static etch to below 25 A/min for iron-catalyzed systems. Surprisingly very low levels of PEI are effective in the slurry. Levels of PEI in the slurry range from 0.1 ppm to 10 ppm and preferably from 0.5 ppm to less than 5 ppm, such as from 1 ppm to 3 ppm. One problem with this type of corrosion inhibitor is that it can lead to foaming (a serious manufacturing problem) when present in quantities as little as 10 ppm or 20 ppm depending on mole weight and on other factors. At such concentrations as are preferred for slurries used in this invention, there is no foaming.

Suitable oxidizing agents include, for example, one or more per-compounds, which comprise at least one peroxy group (—O—O—). Suitable per-compounds include, for example, peroxides (e.g., hydrogen peroxide and urea hydrogen peroxide), persulfates (e.g., monopersulfates and dipersulfates), percarbonates, perchlorates, perbromates, periodates, and acids thereof, and mixtures thereof, and the like, peroxyacids (e.g., peracetic acid, perbenzoic acid, m-chloroperbenzoic acid, salts thereof), mixtures thereof, and the like. Preferred oxidizing agents include hydrogen peroxide, urea-hydrogen peroxide, sodium or potassium peroxide, benzyl peroxide, di-t-butyl peroxide, peracetic acid, monopersulfuric acid, dipersulfuric acid, iodic acid, and salts thereof, and mixtures thereof. Hydrogen peroxide ($H_2O_2$) or periodic acid is a preferred oxidizing agent. In an embodiment, the oxidizing agent is hydrogen peroxide. Strong acid oxidizers, such as nitric acid, can also be used. The per-type oxidizer or strong acid oxidizer is typically present in an amount between 0.1% and 10%, for example between 0.5% and 6%, and is advantageously between 1% and 5% by weight. When used, the preferred concentration of the $H_2O_2$ is from 0.5% to 4%, for example between 1% and 3%.

In an embodiment, the oxidizing agent is one (e.g., hydrogen peroxide) that is capable of forming free radicals in the presence of iron or copper compounds present in the polishing composition that results in increased tungsten removal rates.

Suitable abrasives for this invention include, but are not limited to, alumina, ceria, germania, silica, titania, zirconia, and mixtures thereof. In one embodiment, the abrasive is silica (colloidal silica or fumed silica). In an embodiment, the abrasive is colloidal silica. In a preferred embodiment there is at least 0.1% by weight of an abrasive compared to the total weight of the abrasive and the liquid. The abrasive level in the slurry is not limited but preferably is less than 5%, more preferably about 3 weight percent or less, and in some embodiments is less than 1 weight percent by weight compared to the total weight of the abrasive and the liquid.

In an embodiment, a metal-modified abrasive, such as iron-coated silica, is present as a component. This component serves to induce free radical formation from a per-type oxidizer to increase the removal rate of tungsten (or other metals).

In various embodiments, the slurry can be comprised of two or more different abrasives having different sizes. In these embodiments, the total level of abrasive is preferably less than 1 weight percent.

The choice of acid is not limited provided that the strength of the acid is sufficient to afford a pH of 2-5 for the slurry. Examples of suitable acids are mineral acids such as nitric acid, phosphoric acid, or sulfuric acid.

The solvent which provides the principle portion of the liquid component can be water or mixtures of water with other liquids that are miscible with water. Examples of other liquids are alcohols, such as methanol and ethanol. Advantageously the solvent is water.

The slurry composition used in the method of this invention is acidic and has a pH ranging from 2 to 5. Preferably, the pH ranges from 2.5 to 4.5, and, more preferably, the pH ranges from 2.5 to 4, for example, from 2.5 to 3.5.

The presence of carbon-containing compounds (other than a few ppm of polyethyleneimine) and especially carboxylic acids is not preferred in the slurry composition. In a preferred embodiment, the polishing composition is free of carboxylic acids, or contains less than 50 ppm, 20 ppm, 10 ppm, or 5 ppm of carbon-containing compounds, including the polyethyleneimine. Another carbon-containing compound that is not preferred is polyether amine. In a preferred embodiment, the composition is free of polyether amine, or contains less than 50 ppm, 20 ppm, 10 ppm, or 5 ppm of carbon-containing compounds, including the polyether amine. Carbon-containing chemicals increase disposal concerns as they can not be readily removed.

The presence of fluorine compounds in the slurry is not preferred as they attack the dielectrics. In a preferred embodiment, the polishing composition is free of fluoride compounds, or contains less than 50 ppm, 20 ppm, 10 ppm, or 5 ppm of fluorine-containing compounds.

Advantageously no reducing agents, such as formic acid, oxalic acid or formaldehyde are present in the slurry.

Some CMP patents describe a polyamine azole as a component in CMP slurry(s). It is emphasized here that a polyamine azole is not a polyethyleneimine.

Method

The method of this invention entails use of the aforementioned composition (as disclosed supra) for chemical mechanical planarization of substrates comprised of tungsten and dielectric materials. In the method, a substrate (e.g., a wafer) is placed face-down toward a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

In the method of the invention with use of the associated slurry, a removal rate of tungsten of at least 2000 Angstroms per minute is maintained upon chemical-mechanical polishing thereof when polishing is done at 3 psi of down force. Higher removal rates are attained when down force values greater than 3 psi are used.

As indicated above, an embodiment of the invention is a composition for chemical mechanical polishing a tungsten-containing substrate. In an embodiment, the surface of the substrate also has at least one feature thereon comprising a dielectric material, at least near the conclusion of the polishing. In an embodiment, the dielectric material is a silicon oxide.

With use of the method and associated slurry of the invention, preferably polysilicon and dielectric layer polishing rates are below 500 angstroms per minute, typically below 250 A/min, and more preferably these polishing rates are below 100 angstroms per minute. The selectivity of these slurries to tungsten over dielectric are between 8 and 40, typically between 12 and 24. Yet even with high selectivities the presence of the 1 to 3 ppm of PEI substantially reduces array erosion (by about 10% to 30%), plug recess (by about 10%), and average dishing (by about 10% to 15%), when used in various embodiments of this invention, compared to comparable slurries not having PEI.

The present invention is further demonstrated by the examples below.

EXAMPLES

General

All percentages are weight percentages unless otherwise indicated.

CMP Methodology

In the examples presented below, CMP experiments were run using the procedures and experimental conditions given below.

GLOSSARY

Components
Fe-Coated Silica: Colloidal silica at 2.5 wt. % solids level having a particle size of approximately 45 nanometers (nm); the silica particles are coated with iron to an extent such that iron atoms are bound to approximately 25% of the available binding sites on the silica particles.
Medium Size Col Sil: Colloidal silica particles (NexSil 50ZK-DI) supplied by Nyacol, Inc., Ashland, Mass. having an average particle size of approximately 80 nm.
Large Size Col Sil: Colloidal silica particles having an average particle size of approximately 180 nm.
Ethyleneimine, Oligomer Mixture Polyethyleneimine with a minor amount of tetraethylenepentamine
  (>=5% and <=20% from MSDS of this product) Supplied by Sigma-Aldrich, St. Louis, Mo.
PEI: Polyethyleneimine (Aldrich, Milwaukee, Wis.)
TEOS: tetraethylorthosilicate
Polishing Pad: Polishing pad, Politex®, and IC1000 were used during CMP, supplied by DOW, Inc, (formerly supplied by Rodel (Rohm and Haas), which is now part of Dow, Inc.).
Parameters
  General
Å or A: angstrom(s)—an unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: slurry flow, ml/min
wt %: weight percentage (of a listed component)
W: TEOS Selectivity: (removal rate of W)/(removal rate of TEOS)
Removal Rates
  Tungsten Removal Rates: Measured tungsten removal rate at a given down pressure. The down pressure of the CMP tool was 3.0 psi in the examples below.
CMP Methodology
  In the examples presented below, CMP experiments were run using the procedures and experimental conditions given below
Metrology
  Tungsten films were measured with a ResMap CDE, model 168, manufactured by Creative Design Engineering, Inc, 20565 Alves Dr., Cupertino, Calif., 95014. The ResMap tool is a four point probe sheet resistance tool. Forty nine point diameter scan at 5 mm edge exclusion for Tungsten film was taken.
CMP Tool
  The CMP tool that was used is a Mirra, manufactured by Applied Materials, 3050 Boweres Avenue, Santa Clara, Calif., 95054. A IC1000, kgroove stacked on a suba IV pad supplied by DOW, Inc, 451 Bellevue Rd., Newark, Del. 19713, (formerly supplied by Rodel) was used on platen 1 for blanket and pattern wafer studies. On Platen 3 a Politex pad, supplied by DOW, Inc. was used for the TEOS defect wafers after polishing on platen 1.
  The IC1000 pad was broken in by conditioning the pad for 18 mins. At 7 lbs down force on the conditioner. The Politex pad was broken in by polishing twenty TEOS dummy wafers with deionized water. In order to qualify the tool settings and the pad break-in two tungsten monitors and two TEOS monitors were polished with Microplanar® CMP3850, supplied by DuPont Air Products NanoMaterials L.L.C. at baseline conditions.
Wafers
  Polishing experiments were conducted using CVD deposited Tungsten wafers. These blanket wafers were purchased from Silicon Valley Microelectronics, 2985 Kifer Rd., Santa Clara, Calif. 95051. The film thickness specifications are summarized below: W: 8,000 Å CVD tungsten, 240 Å TiN, 5000 Å TEOS on silicon.
Polishing Experiments
  In blanket wafer studies, tungsten blanket wafers were polished at baseline conditions. The tool baseline conditions were: table speed; 120 rpm, head speed: 123 rpm, membrane pressure; 3.0 psi, inter-tube pressure; 6.0 psi, retaining ring pressure; 6.5 psi, slurry flow; 120 ml/min.
  The slurry was used in polishing experiments on patterned wafers (SKW5-3, supplied by SWK Associates, Inc. 2920 Scott Blvd. Santa Clara, Calif. 95054). These wafers were measured on the Veeco VX300 profiler/AFM instrument. The 100×100 micron line structure was used for dishing measurement, and 1×1 micron array was used for the erosion measurement. The wafer was measured at center, middle, and edge die positions.

PEI-Containing Corrosion Inhibitors

The corrosion inhibitor used in the slurries of Examples 1-18 was ethyleneimine, oligomer mixture, supplied by Sigma-Aldrich. This product contains polyethyleneimine (PEI) as a major component and tetraethylenepentamine (TEPA) as a minor component. The level of TEPA as reported in the material safety data sheet is greater than or equal to 5% and less than or equal to 20%.

The corrosion inhibitor used in the slurry of Example 19 was polyethyleneimine (PEI) as the sole component (apart from minor impurities, if any). This product was supplied by Aldrich, Milwaukee, Wis.

General Procedure for Making Slurries

All slurries were made using the following general procedure:
  a. In a 5-liter beaker, 473.36 grams of iron-coated silica were added to 2610.12 grams of deionized water and allowed to stir using a magnetic stirrer for 2 minutes.
  b. Under agitation, 29.95 grams of Nyacol NexSil 50ZK-DI were added.
  c. After 2 minutes of stirring, 17.73 grams of large size colloidal silica were added.
  d. After 2 minutes of stirring, 7 grams of ethyleneimine oligomer solution were added.
  e. After 2 minutes of stirring, 11.84 grams of dilute nitric acid were added to pH-adjust the solution to a pH of 2.5.
  f. Directly before polishing, 350 grams of 30% hydrogen peroxide were added.
(Specific Amounts Listed are Those for the Slurry of Example 1.)

Examples 1-4

Slurries were made up and tested as shown in Table 1 with slurry pH varying from 2.5 to 4.0. The data in Table 1 show that while pH of the slurry increases from 2.5 to 4.0, the W/TEOS selectivity also increases due to a decrease in TEOS removal rate of 134 A. Also in this pH range, tungsten removal shows a slight decrease as pH of the slurry increases. As the results shown in Table 1, when pH of the disclosed tungsten slurry gradually increased from 2.5 to 4.0, the removal rates of tungsten and TEOS were decreased gradually, the decreased removal rate percentage of TEOS is larger than the percentage of removal rate decrease for tungsten, thus, the selectivity of W/TEOS is increased from 20 to 46 as the pH was changed from 2.5 to 4.0.

TABLE 1

Effect of pH on W:TEOS selectivity

|  | Example 1: pH 2.5 | Example 2: pH 3.0 | Example 3: pH 3.5 | Example 4: pH 4.0 |
|---|---|---|---|---|
| Fe-coated colloidal silica (wt %) | 0.33 | 0.33 | 0.33 | 0.33 |
| large-size colloidal silica (wt %) | 0.25 | 0.25 | 0.25 | 0.25 |
| intermediate-size colloidal silica (wt %) | 0.15 | 0.15 | 0.15 | 0.15 |
| corrosion inhibitor (wt %) | 0.0002 | 0.0002 | 0.0002 | 0.0002 |
| hydrogen peroxide (wt %) | 3 | 3 | 3 | 3 |
| pH before hydrogen peroxide | 2.5 | 3.0 | 3.5 | 4.0 |
| Removal rates of W at 3.0 psi, 60 sec | 4582 | 4389 | 4377 | 4241 |
| Removal rates of TEOS at 3.0 psi, 60 sec | 227 | 203 | 152 | 93 |
| W:TEOS selectivity | 20 | 22 | 29 | 46 |

Examples 5-7

Slurries were made and tested with varying hydrogen peroxide concentration as shown in Table 2. The effects of peroxide concentration on the removal rates of tungsten and TEOS and selectivity of W/TEOS are listed in Table 2. When increasing the hydrogen peroxide concentration from 1% to 2, then, to 3%, the removal rates of tungsten were increased by about 43%, and 24%, respectively. The increase of hydrogen peroxide concentrations has almost no effects on the removal rates of TEOS film. The increase of the tungsten removal rates and almost unchanged TEOS removal rates at increased hydrogen peroxide concentrations led to the increase of the selectivity of W/TEOS. The W/TEOS selectivity increased from 12 to 20 as the hydrogen peroxide level was increased from 1 to 3 weight percent.

TABLE 2

Effect of hydrogen peroxide concentration on W:TEOS selectivity

|  | Example 5: 1% $H_2O_2$ | Example 6: 2% $H_2O_2$ | Example 7: 3% $H_2O_2$ |
|---|---|---|---|
| Fe-coated colloidal silica (wt %) | 0.33 | 0.33 | 0.33 |
| large-size colloidal silica (wt %) | 0.25 | 0.25 | 0.25 |
| intermediate-size colloidal silica (wt %) | 0.15 | 0.15 | 0.15 |
| corrosion inhibitor (wt %) | 0.0002 | 0.0002 | 0.0002 |
| hydrogen peroxide (wt %) | 1 | 2 | 3 |
| Removal rates of W at 3.0 psi, 60 sec | 2587 | 3704 | 4582 |
| Removal rates of TEOS at 3.0 psi, 60 sec | 207 | 194 | 227 |
| W:TEOS selectivity | 12 | 19 | 20 |

Examples 8-13

Slurries were made and tested with varying levels of intermediate-size colloidal silica as shown in Table 3. This table shows the effect of increasing the concentration of this intermediate-size colloidal silica on the removal rates of tungsten and TEOS. As shown in Examples 8 and 9, the removal rates of tungsten is increased from 3376 Angstroms/min. to 4582 Angstroms/min. by introducing and using 0.15% intermediate-size colloidal silica abrasive. This represents about 36% removal rate increase in the removal rate of tungsten. Tungsten removal rate is increased by more than 47% by increasing this silica abrasive component from 0 to 1%; when this intermediate-size abrasive is increased from 0.15 to 3%, the removal rate of tungsten reached the maximum removal rate when 1% intermediate-size colloidal silica abrasive is used; see Example 11. The TEOS removal rate increases as the intermediate-size abrasive concentration is raised over the range 0.15 wt % to 3 wt %, yielding a steady decrease in W/TEOS selectivity as the concentration of intermediate-size abrasive silica is increased.

TABLE 3

Effect of intermediate particle size colloidal silica concentration on W:TEOS selectivity

|  | Example 8: 0% silica | Example 9: 0.15% silica | Example 10: 0.5% silica | Example 11: 1% silica | Example 12: 2% silica | Example 13: 3% silica |
|---|---|---|---|---|---|---|
| small surface-modified colloidal silica (wt %) | 0.33 | 0.33 | 0.33 | 0.33 | 0.33 | 0.33 |
| large-size colloidal silica (wt %) | 0.25 | 0.25 | 0.25 | 0.25 | 0.25 | 0.25 |
| intermediate-size colloidal silica (wt %) | 0 | 0.15 | 0.5 | 1 | 2 | 3 |
| corrosion inhibitor (wt %) | 0.0002 | 0.0002 | 0.0002 | 0.0002 | 0.0002 | 0.0002 |
| hydrogen peroxide (wt %) | 2 | 2 | 2 | 2 | 2 | 2 |
| pH before hydrogen peroxide | 2.5 | 2.5 | 2.5 | 2.5 | 2.5 | 2.5 |
| Removal rates of W at 3.0 psi, 60 sec | 3376 | 4582 | 4619 | 4957 | 4818 | 4610 |
| Removal rates of TEOS at 3.0 psi, 60 sec | — | 227 | 263 | 307 | 344 | 416 |
| W:TEOS selectivity | — | 20 | 18 | 16 | 14 | 11 |

Examples 14-17

Slurries were made and tested with varying levels of corrosion inhibitor (polyethyleneimine) as shown in Table 4. Increasing the corrosion inhibitor concentration from 1 ppm to 2 ppm, then, to 3 ppm, as shown in Table 4, has the effects of decreasing the removal rates of tungsten and slightly increasing of the removal rates of TEOS up to 2 ppm corrosion inhibitor concentration, or slightly decreasing the removal rate of TEOS when the concentrations of corrosion inhibitor increased from 2 ppm to 3 ppm, therefore, the W:TEOS selectivity is first reduced from 33 to 28, then, to 17, after that, the selectivity of W:TEOS remains similar.

TABLE 4

Effect of corrosion inhibitor concentration on W:TEOS selectivity

|  | Example 14: 0 ppm corrosion inhibitor | Example 15: 1 ppm corrosion inhibitor | Example 16: 2 ppm corrosion inhibitor | Example 17: 3 ppm corrosion inhibitor |
|---|---|---|---|---|
| Fe-coated colloidal silica (wt %) | 0.33 | 0.33 | 0.33 | 0.33 |
| large-size colloidal silica (wt %) | 0.25 | 0.25 | 0.25 | 0.25 |
| intermediate-size colloidal silica (wt %) | 0.15 | 0.15 | 0.15 | 0.15 |
| corrosion inhibitor (wt %) | 0 | 0.0001 | 0.0002 | 0.0003 |
| hydrogen peroxide (wt %) | 3 | 3 | 3 | 3 |
| pH before hydrogen peroxide | 2.5 | 2.5 | 2.5 | 2.5 |
| Removal rates of W at 3.0 psi, 60 sec | 5265 | 4561 | 3966 | 3608 |
| Removal rates of TEOS at 3.0 psi, 60 sec | 158 | 163 | 234 | 205 |
| W:TEOS selectivity | 33 | 28 | 17 | 18 |

Example 18 and Comparative Example 1

This inventive example and comparative example illustrate improved performance of the inventive slurry over a standard slurry (Comparative Example 1) which does not have a PEI-containing corrosion inhibitor nor an intermediate size colloidal silica component. In addition to tunability, this inventive CMP slurry composition provides minimal dishing and erosion of tungsten dies as compared to the standard slurry. Data in Table 5 show a comparison of dishing and erosion between the standard slurry and the inventive tungsten slurry. Dishing and erosion are measured on dies in the center, middle, and edge of a SKW 5-3 pattern wafer. Dishing is reported as the step-height difference, in Angstroms, between metal and dielectric, measured at 100 µm lines; erosion is reported as the step-height difference between 1×1 µm line arrays of metal and dielectric and the dielectric surrounding those arrays. As shown in Table 5, polishing results with the inventive slurry showed an improved dishing performance of between approximately 10 to 20% over that afforded by the standard slurry. Plug recess was also improved with the inventive slurry, and erosion performance was similar to that of standard slurry.

TABLE 5

Effect of corrosion inhibitor concentration on dishing and erosion

|  | Comparative Example 1: Standard Slurry | Example 18: |
|---|---|---|
| Iron-coated colloidal silica (wt %) | 0.25 | 0.33 |
| large-size colloidal silica (wt %) | 0.25 | 0.25 |
| intermediate-size colloidal silica (wt %) | 0 | 0.15 |
| corrosion inhibitor (wt %) | 0 | 0.0002 |
| hydrogen peroxide (wt %) | 3 | 3 |
| pH before hydrogen peroxide | 3.5 | 2.5 |
| average dishing (Å), center die, 100 µm line | 2197 | 1843 |
| average dishing (Å), middle die, 100 µm line | 2112 | 1720 |
| average dishing (Å), edge die, 100 µm line | 2357 | 2152 |
| plug recess (Å) | 115 | 105 |
| array erosion (Å), center die, 2 × 3 µm array | 70 | 69 |
| array erosion (Å), middle die, 2 × 3 µm array | 47 | 58 |
| array erosion (Å), edge die, 2 × 3 µm array | 53 | 99 |
| array erosion (Å), center die, 3 × 3 µm array | 96 | 66 |
| array erosion (Å), middle die, 3 × 3 µm array | 70 | 61 |
| array erosion (Å), edge die, 3 × 3 µm array | 61 | 114 |
| array erosion (Å), center die, 0.15 µm contact | 34 | 22 |
| array erosion (Å), middle die, 0.15 µm contact | 14 | 40 |
| array erosion (Å), edge die, 0.15 µm contact | 12 | 31 |

Example 19 and Comparative Example 1

This inventive example and comparative example illustrate improved performance of the inventive slurry over a standard slurry (Comparative Example 1) which does not have a PEI-containing corrosion inhibitor nor a intermediate size colloidal silica component. Data in Table 6 show a comparison of dishing, erosion and tungsten plug recess between the standard slurry and the inventive tungsten slurry. In the inventive Example 19 tungsten CMP slurry, only PEI is used as corrosion inhibitor; there is no TEPA in the PEI-containing corrosion inhibitor. Dishing and erosion are measured on dies in the center, middle, and edge of a SKW 5-3 pattern wafer. Dishing is reported as the step-height difference, in Angstroms, between metal and dielectric, measured at 100 µm lines; erosion is reported as the step-height difference between 1×1 µm line arrays of metal and dielectric and the dielectric surrounding those arrays. As shown in Table 6, polishing results with the Example 19 slurry showed improved tungsten plug recess results—i.e., reduced from 115 Angstroms to 77 Angstroms for the standard slurry and Example 19 slurry, respectively.

TABLE 6

Effect of corrosion inhibitor concentration on dishing and erosion

|  | Comparative Example 1: Standard Slurry | Example 19: |
|---|---|---|
| small surface-modified colloidal silica (wt %) | 0.25 | 0.33 |
| large-particle colloidal silica (wt %) | 0.25 | 0.25 |
| intermediate-size colloidal silica (wt %) | 0 | 0.15 |
| corrosion inhibitor (wt %) | 0 | 0.0005 |
| hydrogen peroxide (wt %) | 3 | 3 |
| pH before hydrogen peroxide | 3.5 | 2.5 |
| average dishing (Å), center die, 100 µm line | 2197 | 1964 |
| average dishing (Å), middle die, 100 µm line | 2112 | 2235 |
| average dishing (Å), edge die, 100 µm line | 2357 | 2281 |
| plug recess (Å) | 115 | 77 |
| array erosion (Å), center die, 2 × 3 µm array | 70 | 49 |
| array erosion (Å), middle die, 2 × 3 µm array | 47 | 58 |
| array erosion (Å), edge die, 2 × 3 µm array | 53 | 95 |
| array erosion (Å), center die, 3 × 3 µm array | 96 | 61 |
| array erosion (Å), middle die, 3 × 3 µm array | 70 | 82 |
| array erosion (Å), edge die, 3 × 3 µm array | 61 | 121 |
| array erosion (Å), center die, 0.15 µm contact | 34 | 17 |
| array erosion (Å), middle die, 0.15 µm contact | 14 | 28 |
| array erosion (Å), edge die, 0.15 µm contact | 12 | 26 |

Static Etch Rate Measurements

Static etch rate is a measurement that provides empirical data related to the chemical activity level of a CMP slurry. Typically, a higher static etch rate is indicative of a more aggressive chemical composition that leads to the relative fast etching of the related metal film surfaces, with a higher probability of causing more metal corrosion defects. Chips cut from a tungsten blanket wafer were exposed to the standard tungsten slurry (Comparative Example 1), the Example 18 slurry, and the Example 19 slurry formulations, respectively. Table 7 shows the static etch rates in the unit of Å/minute for the standard tungsten slurry compared with those static etch rates obtained with use of the Examples 18 and 19 slurries. Table 8 shows the normalized data collected at room temperature, 40° C., and 60° C. for 20, 5, and 2 minutes, respectively. Many manufacturers only report static etch at room temperature, but polishing generates heat. In some production operation interruptions, a wafer may be exposed to static etch from a slurry at polishing temperature, that is 40 to 60° C. Static etch rates are problematic with most oxidizers and are more pronounced with iron-peroxide oxidizer systems at elevated temperature, which have particularly strong activity. At room and elevated temperatures, addition of the selected corrosion inhibitor lowered the static etch rate by at least 84%. The elevated-temperature data suggests superior corrosion protection at temperatures reached due to friction during polishing.

TABLE 7

Effect of corrosion inhibitor on static etch rate of tungsten metal

|  | Static etch rate (Å/minute) | | |
|---|---|---|---|
|  | Ambient Temperature | 40° C. | 60° C. |
| Comparative Example 1 (Standard Slurry) | 284 | 819 | 2629 |
| Example 18 Slurry | 10 | 108 | 389 |
| Example 19 Slurry | 17 | 80 | 483 |

TABLE 8

Effect of corrosion inhibitor on normalized static etch rate of tungsten metal

|  | Static etch rate (Å/minute), normalized | | |
|---|---|---|---|
|  | Ambient Temperature | 40° C. | 60° C. |
| Comparative Example 1 (Standard Slurry) | 1 | 1 | 1 |
| Example 18 Slurry | 0.04 | 0.13 | 0.15 |
| Example 19 Slurry | 0.06 | 0.10 | 0.18 |

A growing trend among CMP slurry providers is the lowering of their customers' cost of consumables through product concentration. The practice of providing concentrated slurry is becoming a demand across the CMP industry. The level of concentration, however, must be prudently chosen so as not to jeopardize the stability and shelf-life time of the product. The slurry composition of Example 18 was concentrated to 5× (five times the point of use concentration). Dishing and erosion data was obtained using both fresh (0 days) and 50 day concentrate samples after dilution to point of use levels. The data obtained indicated that after aging of the 5× concentrated Example 18 slurry for 50 days, the concentrated slurry, when diluted to point-of-use concentration, exhibited little change (less than ten percent) in tungsten and TEOS removal rates. Dishing performance varied by 8 to 25%, and erosion changed by 5 to 20% over 50 days of aging.

The 5× slurry of Example 19 was similarly tested. The slurry composition of Example 19 was concentrated to 5× and subjected to testing in the same manner as shown above for the Example 18 slurry. The data obtained indicated that after aging of the 5× concentrated Example 19 slurry for 50 days, the concentrated slurry, when diluted to point-of-use concentration, exhibited a slight increase in the removal rates of tungsten and TEOS. Dishing performance varied by almost no-change to less than 15% over 50 days of aging.

Slurry performance changes as slurries age. The aging process includes both short term aging (aging of prepared slurries in tanks within three days of use) and long term aging (aging of slurry concentrates during multiple weeks of storage). It has long been known to supplement slurries with one or more compounds (typically adding oxidizer) to counteract short term aging effects. This invention addresses long term aging effects.

Preferred slurries of the present invention include iron-coated silica of a first (smaller) size and also silica without iron thereon of a second (larger) size. Most preferred is an embodiment also including a third abrasive of an intermediate size. As a result of having iron coated and not iron coated abrasives, certain compounds, such as carboxylic acids, should be avoided. Generally, organic materials also adversely affect aging, so the preferred total organics (excluding oxidizers) is between 0.1 and 10 ppm. Any organic corrosion inhibitor present must therefore be effective in an amount of a few ppm or less. Polyethyleneimine, especially branched polyethyleneimine, is a preferred corrosion inhibitor.

We have found that even with slurry concentrates that minimize organics, which can exacerbate long term aging effects, slurry concentrates exhibit some effects on aging, especially relating to dishing and to absolute tungsten removal rates. Note that slurry concentrates are free of oxidizers, which are added when the slurry concentrate is tank mixed with water and oxidizer to form a polishing slurry. It is known to tune slurries by adding various components thereto. The invention here is a method of mixing two different slurry concentrates (called for convenience a primary slurry concentrate and a secondary slurry concentrate), wherein the ratio of mixing of the slurry concentrates depends on the long-term age of the primary slurry concentrate, to normalize slurry performance against aging.

The primary slurry concentrate and a secondary slurry concentrates can differ by one or more of: the amount of first small abrasive, the amount of second larger abrasive, optionally the amount of a third intermediate abrasive, the amount of corrosion inhibitor, and the amount of mineral acid (affecting the resulting pH). Additionally, the method contemplates adjusting the amount of oxidizer added depending on the long term age of the primary slurry concentrate. The result of mixing the slurry concentrates is a slurry with substantially identical performance in substrate removal rate, dishing, erosion, and defects as the primary slurry ages from less than a week old to, for example, 26 weeks old or older.

The invention claimed is:

1. A method of chemical mechanical polishing of a substrate comprising tungsten, said method comprising: movably contacting a surface of the substrate with a) an abrasive, and b) a liquid component consisting essentially of water, an acid sufficient to provide a pH of 2 to 5, a per-type oxidizer, between 1 ppm and 100 ppm of an iron compound which induces free radical formation from the per-type oxidizer to increase tungsten removal rates, and between 0.1 and 10 ppm of a poly(alkyleneimine), wherein the liquid component is substantially free of carboxylic acids, and wherein the polishing removes greater than 2000 angstroms per minute of tungsten at 3 psi downforce.

2. The method of claim 1 wherein the poly(alkyleneimine) is a polymer or oligomer of ethyleneimine.

3. The method of claim 2 wherein the poly(alkyleneimine) has a molecular weight from about 10000 to over 140000.

4. The method of claim 2 wherein the liquid component is substantially free of chelating compounds.

5. The method of claim 2 wherein the polishing removes greater than 4000 angstroms per minute of tungsten at 3 psi downforce.

6. The method of claim 2 wherein the substrate further comprises a dielectric material, wherein the polishing removes less than 400 angstroms per minute of dielectric material at 3 psi downforce.

7. The method of claim 2 wherein the substrate further comprises polysilicon, wherein the polishing removes less than 400 angstroms per minute of polysilicon at 3 psi downforce.

8. The method of claim 2 wherein the pH of the liquid component is between 2.5 to 4.

9. The method of claim 2 wherein the abrasive comprises a first silica abrasive having an average diameter of between 30 and 90 nm and having said iron bound to a surface thereof, said iron being able to induce free radical formation in a per-type oxidizer to increase tungsten removal rates; and further comprising a second silica abrasive having an average diameter of between 120 and 240 nm, wherein the weight percent of the second abrasive is between 0.5 and 1.5 times the weight percent of the first abrasive.

10. The method of claim 1 wherein the liquid component is substantially free of fluoride-containing compounds.

11. The method of claim 1 wherein the poly(alkyleneimine) is a polyethyleneimine and is present in an amount below 6 ppm.

12. The method of claim 1 wherein the abrasive comprises silica in an amount between 0.1% to 5% by weight compared to the weight of the abrasive and the liquid component, and wherein the liquid component contains water, $H_2O_2$ in an amount from 0.5% to 4%, between 1 ppm and 100 ppm of an iron compound which induces free radical formation from the per-type oxidizer to increase tungsten removal rates, and between 0.1 and 6 ppm of a polyethyleneimine.

13. A method of chemical mechanical polishing of a substrate comprising tungsten, said method comprising: movably contacting a surface having tungsten thereon with a) an abrasive suspended in a liquid to form a slurry, said slurry abrasive ranging between 0.3 and 1% by weight, said liquid consisting essentially of water, an acid sufficient to provide a pH of 2 to 5, a per-type oxidizer, and between 0.1 and 10 ppm of a poly(alkyleneimine), said liquid being substantially free of fluoride-containing compounds, wherein the polishing removes greater than 2000 angstroms per minute of tungsten.

14. The method of claim 13 wherein the polishing removes greater than 4000 angstroms per minute of tungsten at 3 psi downforce.

15. The method of claim 13 wherein the poly(alkyleneimine) is a branched polyethyleneimine and is present in an amount below 6 ppm.

16. The method of claim 13 wherein the substrate further comprises a dielectric material, wherein the polishing removes less than 400 angstroms per minute of dielectric material at 3 psi downforce.

17. The method of claim 13 wherein the substrate further comprises polysilicon, wherein the polishing removes less than 400 angstroms per minute of polysilicon at 3 psi downforce.

18. The method of claim 13 wherein the pH of the liquid component is between 2.5 to 4.

19. A method of chemical mechanical polishing of a substrate comprising tungsten, said method comprising: movably contacting a surface of the substrate with a) an abrasive, and b) a liquid component consisting essentially of water, an acid sufficient to provide a pH of 2 to 5, a per-type oxidizer, between 1 ppm and 60 ppm of an iron compound which induces free radical formation from the per-type oxidizer to increase tungsten removal rates, and between 0.1 and 10 ppm of a poly(alkyleneimine), and wherein the polishing removes greater than 2000 angstroms per minute of tungsten.

20. The method of claim 19 wherein the poly(alkyleneimine) comprises polyethyleneimine present in an amount between 1 and 4 ppm.

* * * * *